United States Patent
Hishiyama

(10) Patent No.: US 6,373,313 B1
(45) Date of Patent: Apr. 16, 2002

(54) DELAY TIME REGULATION METHOD AND DELAY TIME REGULATION CIRCUIT

(75) Inventor: Hiroyuki Hishiyama, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/573,612

(22) Filed: May 19, 2000

(30) Foreign Application Priority Data

May 21, 1999 (JP) .............................. 11-141575

(51) Int. Cl.[7] .............................................. H03H 11/26
(52) U.S. Cl. ........................................ 327/276; 327/262
(58) Field of Search .................................. 327/262, 276, 327/277, 278, 284, 298, 393

(56) References Cited

U.S. PATENT DOCUMENTS

| 5,237,224 | A | | 8/1993 | DeLisle et al. ............... 327/276 |
| 5,278,457 | A | * | 1/1994 | Fujita et al. ................. 327/237 |
| 6,177,845 | B1 | * | 1/2001 | Moll .............................. 331/49 |

FOREIGN PATENT DOCUMENTS

| JP | 6-268490 | 9/1994 |
| JP | 7-248847 | 9/1995 |
| JP | 7-321619 | 12/1995 |
| JP | 10-108077 | 4/1998 |

* cited by examiner

Primary Examiner—Kenneth B. Wells
Assistant Examiner—Cassandra Cox
(74) Attorney, Agent, or Firm—Young & Thompson

(57) ABSTRACT

The delay time of a variable delay circuit is set to a desired value by: sequentially applying a plurality of clocks of different frequencies to a variable delay circuit; finding, for each clock, the amount of change in delay time with respect to change in a delay time selection signal, which is a signal for setting the delay time of the variable delay circuit; finding a linear coefficient of the characteristic of the delay time of the variable delay circuit with respect to the delay time selection signal from the difference in the amounts of change with respect to the difference in clock frequencies; finding an amount of offset with respect to the delay time selection signal that pertains to the variable delay circuit from the amounts of change and frequencies of the clocks; and finding the delay time selection signal from the linear coefficient and the difference between the desired delay time and the offset amount.

8 Claims, 6 Drawing Sheets

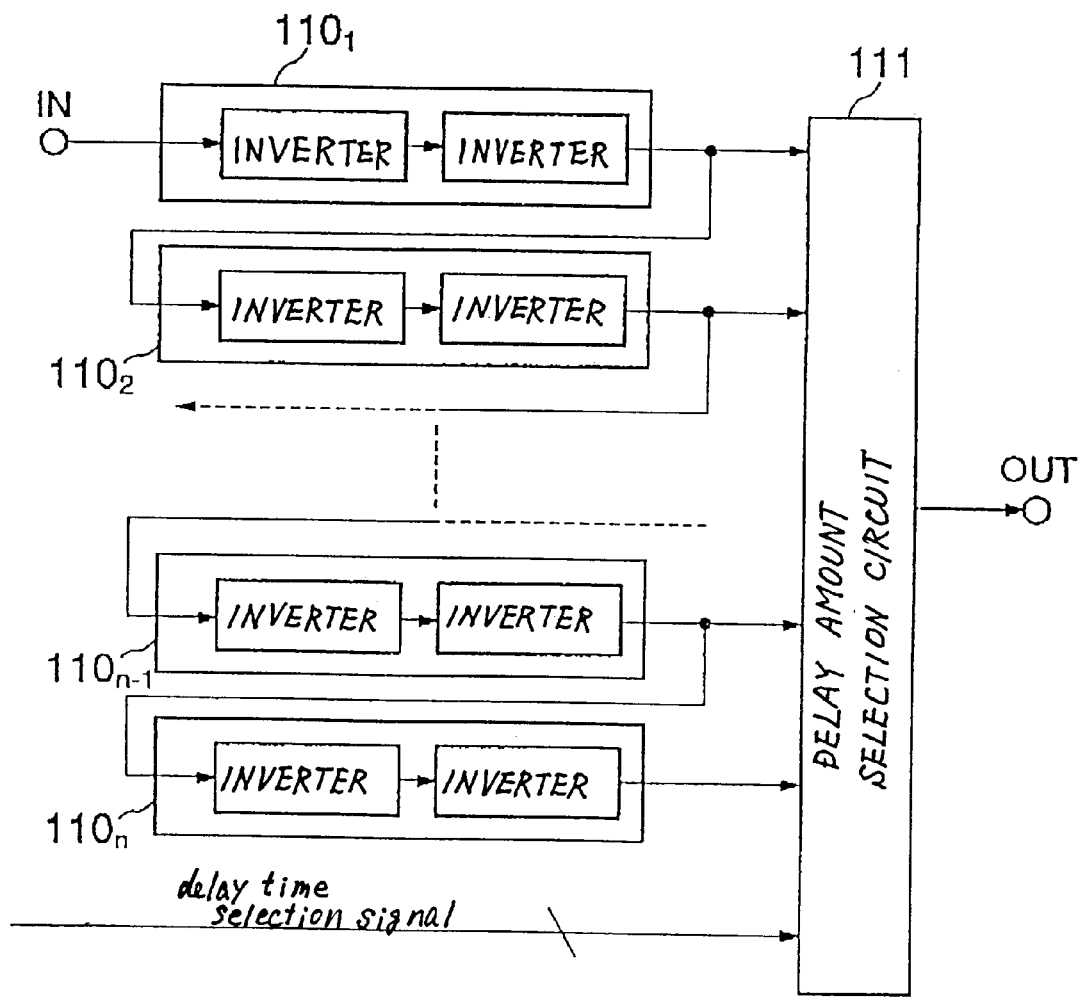
F I G. 2

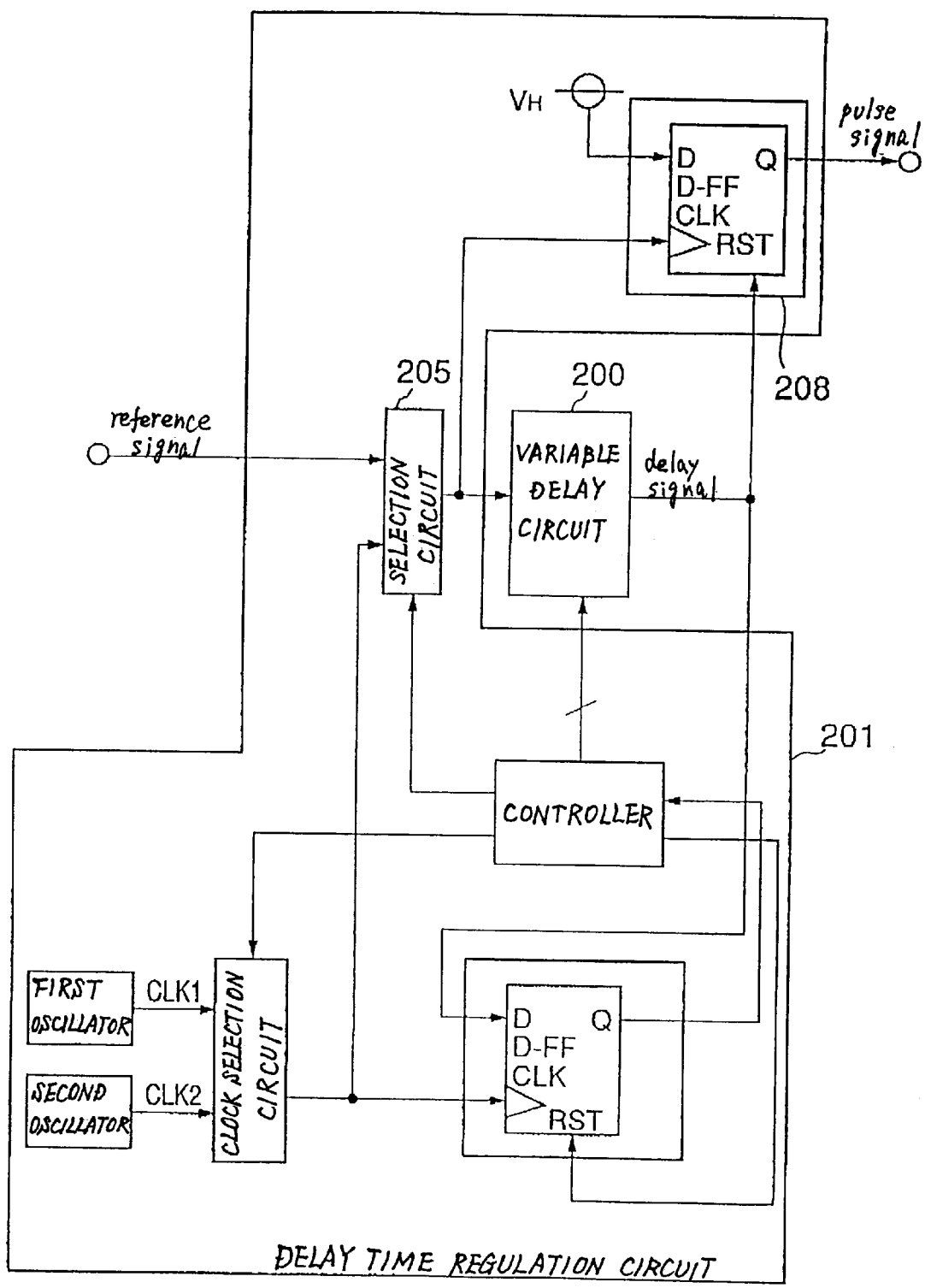
F I G. 4

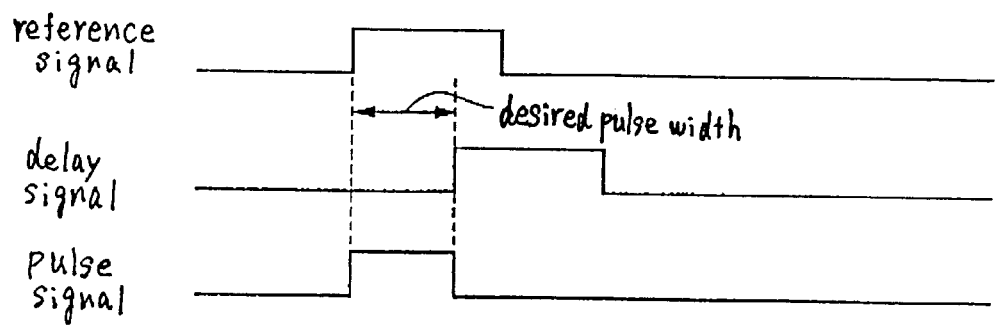
F I G. 5A
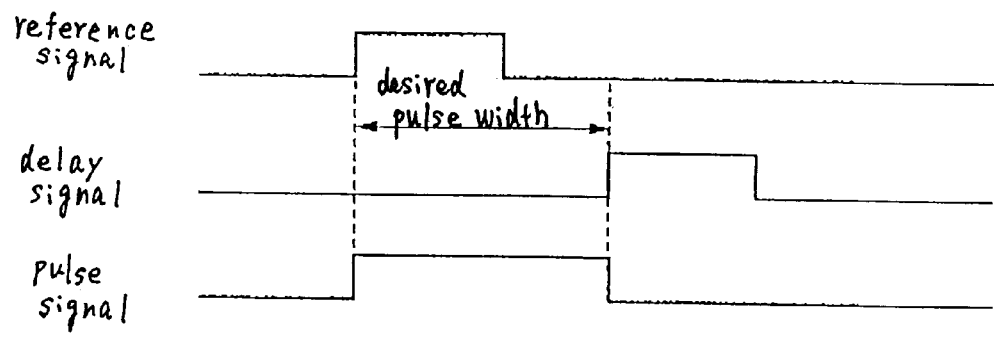
F I G. 5B

DELAY TIME REGULATION METHOD AND DELAY TIME REGULATION CIRCUIT

BACKGROUND OF THE INVENTION

1. Field of the Invention

The present invention relates to a method of regulating delay time and to a delay time regulation circuit for setting the delay time of a variable delay circuit to a desired value.

2. Description of the Related Art

With the advances in high-speed processing in information processing devices in recent years, signal delay has become a problem when transmitting and receiving information between LSI circuits. In particular, there exists the danger that variations in the signal delay time or temperature fluctuations between LSI circuits may prevent the establishment of synchronization of transmission clocks pulses in the I/O circuits of the LSI circuits. To solve problems caused by this type of signal delay, the prior art has proposed devices for shortening the signal delay time.

As systems have become larger in scale, however, LSI circuits are each arranged at greater distances from each other, with the result that such factors as wiring; capacitance produce delays in signal transfer despite increases in operation cycles. To guarantee reliable operation of a system, it is more important to reduce. variations in signal delay times of each LSI circuit than to shorten the signal delay time within an LSI circuit.

Generally, variations in the delay times of different LSI circuits increase due to such factors as fluctuation in power source. voltage, temperature fluctuations, changes in elapsed time, and differences in fabrication lot, while variations in the delay time of circuits within the same LSI circuit are substantially equal.

One method that has been adopted involves providing variable delay circuits within an LSI circuit and then setting the delay times of each LSI circuit so as to reduce variations in the delay times. In such a case, a delay time regulation circuit is provided in an LSI circuit for setting the delay time of the variable delay circuit to a desired value.

However, because the delay time of a variable delay circuit also changes due to such factors as temperature fluctuation in the same way as the internal circuits of an LSI circuit, the delay time regulation circuit preferably has a construction that both facilitates regulation of the delay time of the variable delay circuit and enables regulation of the delay time in accordance with temperature fluctuation even during operation of the LSI circuit.

To meet these demands, Japanese Patent Laid-open No. 264810/92 proposes a delay time regulation circuit that counts the number of pulses in a predefined time window, measures the delay time, and then uses the outcome of this measurement to correct the delay time of a variable delay circuit.

In a prior-art delay time regulation circuit such as described in Japanese Patent Laid-open No. 264810/92, however, a delay time cannot be accurately measured unless a clock is used that is of sufficiently shorter period than the delay time that is to be measured. Measuring delay time at a resolution of, for example, approximately 1 ns necessitates the construction of a circuit that operates at a clock of at least 1 GHz.

Such a circuit is normally difficult to construct. If the period of the clock used for measurement cannot be made sufficiently short, a variable delay circuit for setting to a long delay time must be incorporated in the LSI circuit, and this leads to the problem of an increase in the number of gates for use by the variable delay circuit.

SUMMARY OF THE INVENTION

It is an object of the present invention to provide a delay time regulation method and delay time regulation circuit that are capable of regulating and correcting delay times through the use of a simple structure that employs few gates.

In the present invention for realizing the above-described objects, a plurality of clocks of different frequencies are sequentially applied to a variable delay circuit, and the amount of change in delay time with respect to change in a delay time selection signal, which is a signal for setting the delay time of the variable delay circuit, is found for each clock. The linear coefficient of the characteristic of the delay time of the variable delay circuit with respect to the delay time selection signal is found from the difference in the amounts of change with respect to the difference in the frequencies of the clocks, and the amount of offset with respect to the delay time selection signal that is characteristic of the variable delay circuit is found from the frequencies and amounts of change of the clocks. The delay time selection signal is then found from the linear coefficient and the difference between the desired delay time and the offset amount. This process enables the accurate detection of the characteristic of the delay time of a variable delay circuit with respect to a delay time selection signal.

Accordingly, the variable delay circuit can be accurately set to the desired delay time by correcting in accordance with the results of detecting the delay time of the variable delay circuit. In addition, the delay time of a variable delay circuit can be corrected with respect to variation in delay time arising from such factors as fluctuation in the power source voltage, fluctuation in temperature, change in elapsed time, and differences in fabrication lot. Furthermore, accurate delay times can be obtained with stability through periodic correction of delay times.

In addition, the incorporation of a pulse generation circuit in which output pulses rise with the rise of pulses that are applied to the above-described variable delay circuit and output pulses are reset by the rise of pulses outputted from the variable delay circuit enables pulse signals that have a pulse width that is equal to the delay time of the variable delay circuit. In other words, pulse signals having a desired pulse width can be obtained by using the delay time selection signal to set the delay time of a variable delay circuit to a desired value.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 2 is a block diagram showing one example of the construction of the variable delay circuit shown in FIG. 1;

FIG. 4 is a block diagram showing the construction of the second embodiment of the delay time regulation circuit of the present invention;

FIG. 5A is a waveform chart showing the state of the pulse signals of short pulse width among the input and output waveforms of the pulse generation circuit shown in FIG. 4;

FIG. 5B is a waveform chart showing the state of the pulse signals of long pulse width among the input and output waveforms of the pulse generation circuit shown in FIG. 4.

DETAILED DESCRIPTION OF THE PREFERRED EMBODIMENTS

First Embodiment

Figure 1:
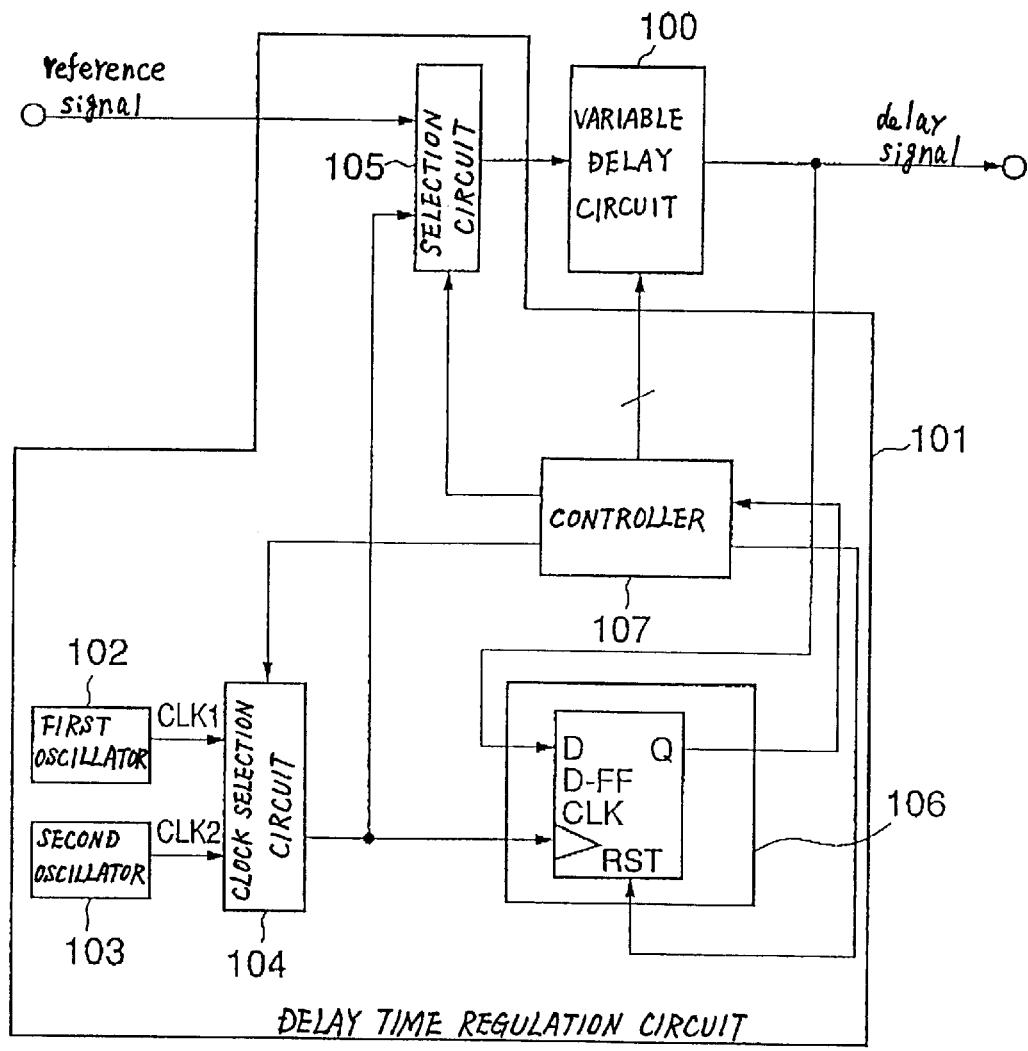
FIG. 1 is a block diagram showing the construction of the first embodiment of the delay time regulation circuit of the present invention.

In FIG. 1, delay time regulation circuit 101 of the present embodiment is made up of: first oscillator 102 and second oscillator 103 for outputting clocks of already known oscillation frequencies; clock selection circuit 104 for selecting and outputting as a test clock one of first clock CLK1 outputted from first oscillator 102 and second clock CLK2 outputted from second oscillator 103; selection circuit 105 for selecting and outputting either a test clock that is outputted from clock selection circuit 104 or a reference signal, which is a delayed signal; change detection circuit 106 for finding the amount of change in delay time that corresponds to a delay time selection signal, which is a signal for setting the delay time of variable delay circuit 100, according to test clocks that are applied to variable delay circuit 100; and controller 107 for controlling each of clock selection circuit 104, selection circuit 105, change detection circuit 106, and variable delay circuit 100.

Change detection circuit 106 employs, for example, a D-flip-flop (hereinbelow abbreviated as "D-FF"). Delay signals outputted from variable delay circuit 100 are applied to data input terminal (D) of the D-FF, and test clocks outputted from clock selection circuit 104 are applied to clock input terminal (CLK).

As shown in FIG. 2, variable delay circuit 100 is a construction in which a plurality (for example, 256) unit delay circuits $110_1$–$110_n$, each made up of two inverters, are connected in a series, the output of each unit delay circuit $110_1$–$110_n$ being applied to delay amount selection circuit 111.

Delay amount selection circuit 111 selects one from among the output signals of unit delay circuits $110_1$–$110_n$ in accordance with a delay time selection signal that is provided from the outside, and outputs the selected signal.

Since unit delay circuits $110_1$–$110_n$ are connected in a series as described hereinabove, the delay time of variable delay circuit 100 is determined by the number of unit delay circuit that are inserted between input terminal (IN) and output terminal (OUT). In a variable delay circuit 100 configured as shown in FIG. 2, it is known that a comparatively good linear characteristic can be obtained by arranging unit delay circuits $110_1$–$110_n$ at positions close to each other.

Figure 3:
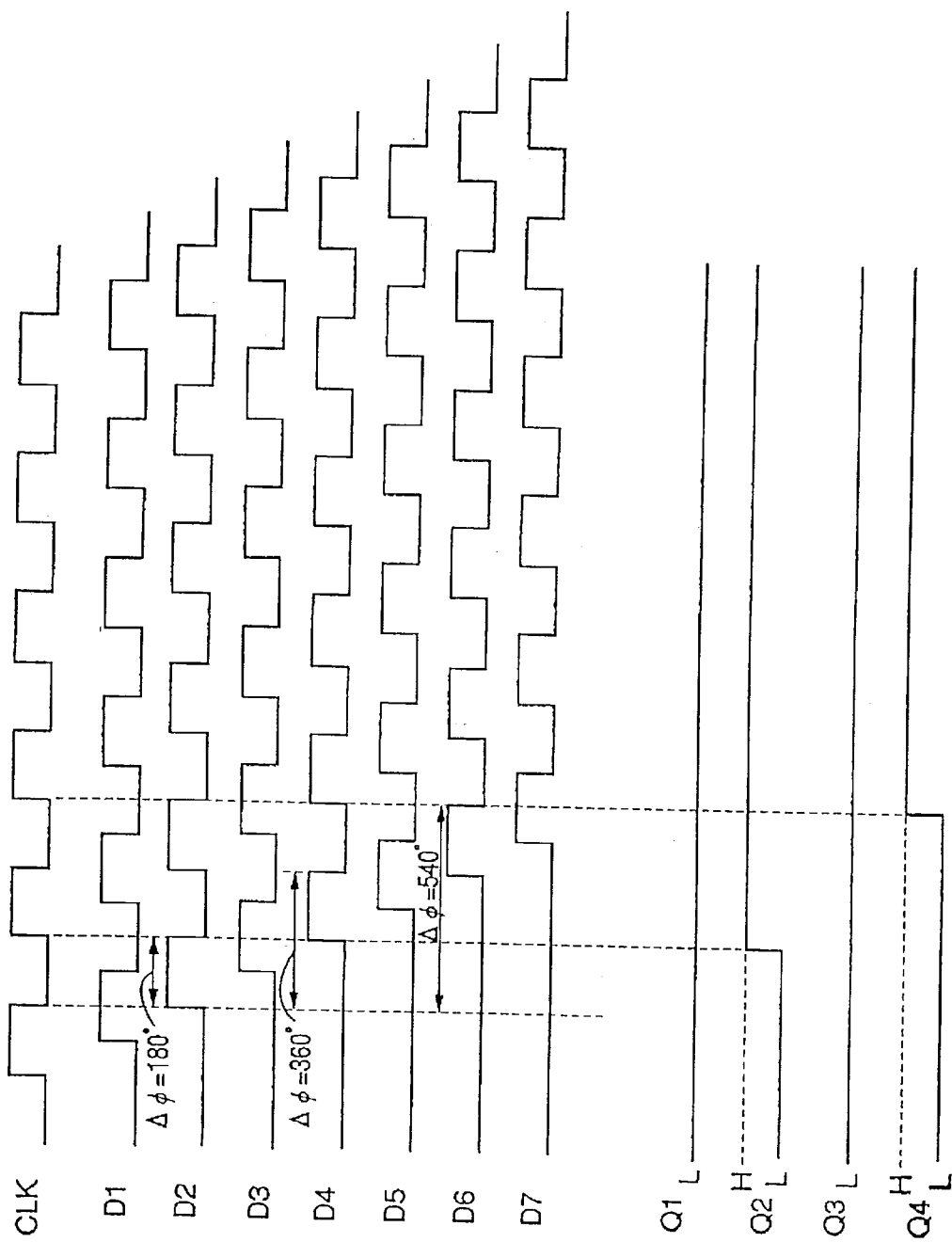
FIG. 3 is a timing chart showing the state of input and output waveforms of the change detection circuit belonging to the delay time regulation circuit shown in FIG. 1.

The operation of setting the delay time of variable delay circuit 100 by delay time regulation circuit 101 of the present embodiment is next explained using FIG. 3 while referring to FIGS. 1 and 2.

When setting the delay time of variable delay circuit 100, clock selection circuit 104 first selects first clock CLK1 outputted from first oscillator 102 as the test clock in accordance with a clock selection signal from controller 107 and outputs to each of selection circuit 105 and change detection circuit 106.

In accordance with the selection signal from controller 107, selection circuit 105 selects the test clock (first clock CKL1) outputted from clock selection circuit 104, and outputs the test clock to variable delay circuit 100. The D-FF of change detection circuit 106 is set to the reset state at the time of initialization by a reset signal outputted from controller 107.

Variable delay circuit 100 selects and outputs the output signal of unit delay circuit $110_1$ that corresponds to the shortest delay time in accordance with the delay time selection signal from controller 107.

At this time, first clock CLK1 (CLK of FIG. 3) is applied to the clock input terminal (CLK) of the D-FF of change detection circuit 106, and the delay signal (D1 of FIG. 3) of first clock CLK1 that was delayed by variable delay circuit 100 is applied to the data input terminal (D), whereby low level (L) is outputted from output terminal (Q) of D-FF (Q1 of FIG. 3).

Controller 107 next controls the delay time selection signal such that the delay time of variable delay circuit 100 gradually increases while monitoring the output level of output terminal (Q) of D-FF.

The delay time of variable delay circuit 100 thus increases, and when the phase difference between the delay signal and first clock CLK1 increases to the point that the phase difference Δφ approaches 180° (D2 in FIG. 3), the relation between these signals satisfies the hold time of D-FF, with the result that the output level of output terminal (Q) of D-FF switches to high level (H) (Q2 in FIG. 3). Controller 107 senses the change in the output level of D-FF and records the value of the delay time selection signal when the output level switches to high level (H) as X1.

Controller 107 causes the delay time of variable delay circuit 100 to increase further by controlling the delay time selection signal (D3 in FIG. 3). The phase difference between the delay signal of variable delay circuit 100 and first clock CLK1 increases further, and when this phase difference Δφ approaches 360° (D4 in FIG. 3), the relation between the signals no longer satisfies the set-up time of D-FF, whereby the output level of output terminal (Q) of D-FF again switches to low level (L) (Q3 in FIG. 3).

When the delay time of variable delay circuit 100 is still further increased (D5 in FIG. 3), the phase difference between the delay signal of variable delay circuit 100 and first clock CLK1 further increases, and when this phase difference Δφ approaches 540° (D6 in FIG. 3), the output level of output terminal (Q) of D-FF again switches to high level (H) (Q4 in FIG. 3). Controller 107 senses the change in the output level of the D-FF, and records the value of the delay time selection signal at the time that the output level switches to high level (H) as X2.

When the values X1 and X2 for first clock CLK1 have been established, controller 107 again sets D-FF to the reset state by sending the reset signal to change detection circuit 106, and then causes clock selection circuit 104 to select second clock CLK2 as the test clock by means of a clock selection signal. The values X3 (corresponding to the above-described X1) and X4 (corresponding to the above-described X2) for second clock CLK2 are then found and recorded by the same process as for the above-described first clock CLK1.

Using the values X1–X4 found by the above-described process, controller 107 next calculates delay time setting amount Ts for variable delay circuit 100 to obtain the desired delay time Td by using the following equations (1)–(5).

$$\Delta C1 = X2 - X1 \quad (1)$$

$$\Delta C2 = X4 - X3 \quad (2)$$

$$k = (C2 - C1)/(\Delta C2 - \Delta C1) \quad (3)$$
$$= (C2 - C1)/(X4 - X3 - X2 + X1)$$

$$T_{off} = (C2 \times \Delta C1 - C1 \times \Delta C2)/(\Delta C2 - \Delta C1) \quad (4)$$
$$= \{C2(X2 - X1) - C1(X4 - X3)\}/(X2 - X1 - X4 + X3)$$

$$Ts = (Td - T_{off})/k \quad (5)$$

In these equations, $\Delta C1$ is the amount of change in the delay time of variable delay circuit 100 for the period (C1) of first clock CLK1, and $\Delta C2$ is the amount of change in the delay time of variable delay circuit 100 for the period (C2) of second clock CLK2. In addition, k is a linear coefficient indicating the linearity of a delay time with respect to the delay time selection signal of variable delay circuit 100, and $T_{off}$ is the offset amount of variable delay circuit 100.

Controller 107 sends a delay time selection signal that corresponds to delay time setting amount Ts calculated using equation (5) to variable delay circuit 100.

During normal operation, selection circuit 105 selects and outputs a reference signal in accordance with the selection signal from controller 107, and the delay time of variable delay circuit 100 is set in accordance with delay time setting amount Ts that is calculated by equation (5). A delay signal can thus be obtained that is delayed from the reference signal by exactly a desired delay time Td.

As a result, the delay time of variable delay circuit 100 can be accurately detected by delay time regulation circuit 101, the delay time of variable delay circuit 100 can be corrected in accordance with the detection results, and as a result, variable delay circuit 100 can be accurately set to a desired delay time. In addition, correction of the delay time of the variable delay circuit 100 can be carried out for variations in delay time due to such factors as fluctuation in the power supply voltage, temperature fluctuation, fluctuation in elapsed time, and difference in fabrication lot. Furthermore, accurate delay times can be obtained with stability if the delay times are periodically corrected.

Although the foregoing explanation describes a method in which two clocks are used to find delay time setting amount Ts of variable delay circuit 100, delay time setting amount Ts of variable delay circuit 100 may also be found by using more clocks of different frequencies. In such a case, a more accurate delay time setting amount Ts of variable delay circuit 100 can be obtained by finding the amounts of change of the delay times of variable delay circuit 100 for each clock and then finding the average value of a plurality of linear coefficients k and offset amounts $T_{off}$ that are obtained by calculations similar to equations (3) and (4).

Second Embodiment

The second embodiment of the delay time regulation circuit of the present invention is next explained with reference to the figures.

In FIG. 4, delay time regulation circuit 201 of the present invention is configured by adding, to delay time regulation circuit 201 which is similar to the first embodiment shown in FIG. 1, pulse generation circuit 208 for outputting a pulse signal having a desired pulse width.

Pulse generation circuit 208 employs, for example, a D flip-flop (hereinbelow abbreviated as "pulse generation D-FF"). Power source voltage $V_H$, which corresponds to high level, is applied to data input terminal (D) of the pulse generation D-FF, and either a reference signal or a test clock selected by selection circuit 205 is applied to clock input terminal (CLK). In addition, the delay signal outputted from variable delay circuit 200 is applied to the reset input terminal (RST) of pulse generation D-FF. The construction is otherwise equivalent to that of the first embodiment, and redundant explanation is therefore omitted.

As shown in FIGS. 5A and 5B, since data input terminal (D) of the pulse generation D-FF of pulse generation circuit 208 in delay time regulation circuit 201 of this embodiment is fixed at high level, the output signal of pulse generation D-FF rises with the rising edge of a pulse that has passed through selection circuit 205 (the reference signal in FIGS. 5A and 5B) and is reset with the rising edge of a delay signal that is outputted from variable delay circuit 200. The pulse signal that is outputted from pulse generation D-FF therefore has a pulse width that is equal to the delay time that is set by variable delay circuit 200.

According to delay time regulation circuit 201 of this embodiment, therefore, a pulse signal can be obtained having a desired pulse width that is free of influence by variations of a semiconductor chip.

Third Embodiment

The third embodiment of the delay time regulation circuit of this invention is next explained with reference to the accompanying figures.

Figure 6:
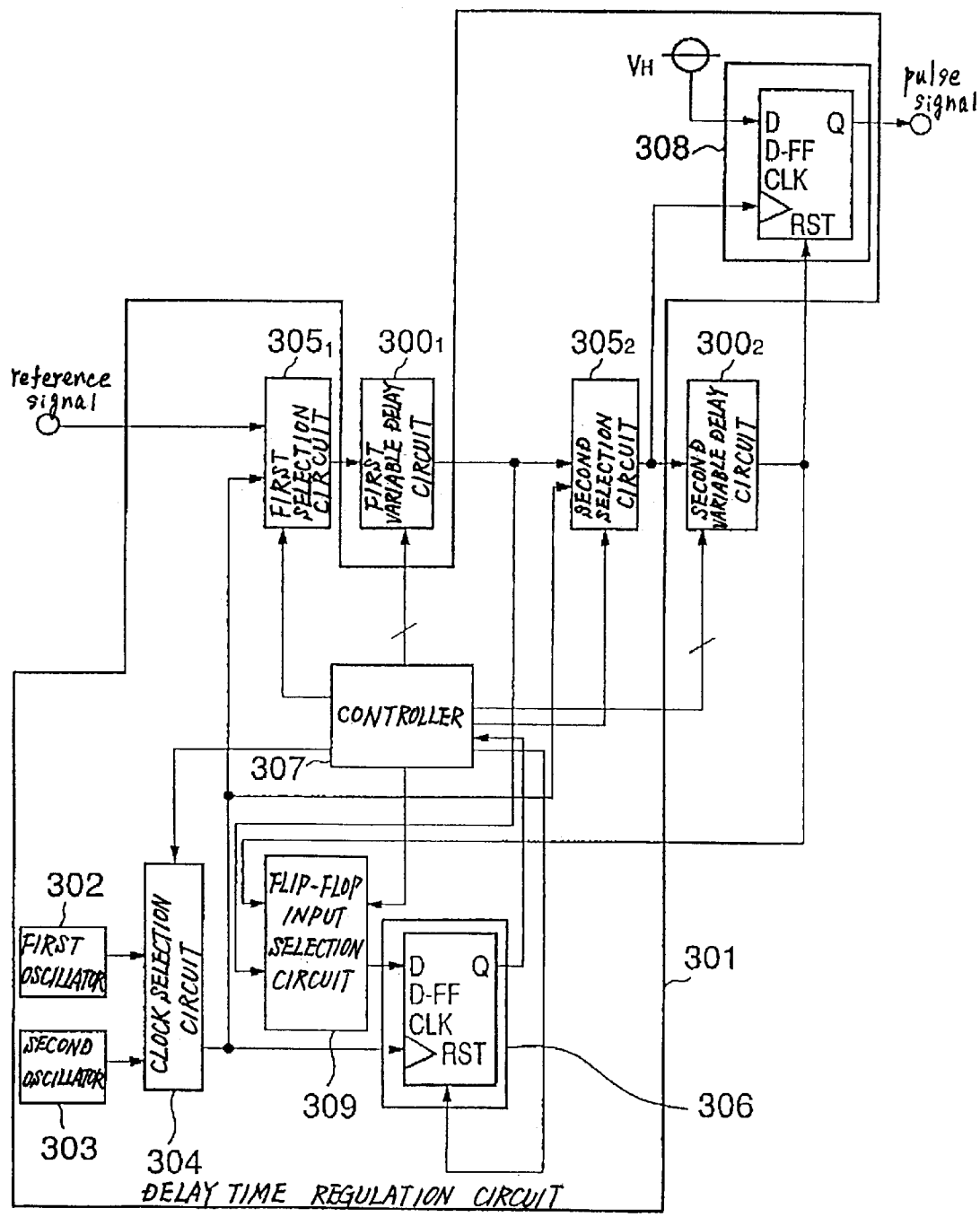
FIG. 6 is a block diagram showing the construction of the third embodiment of the delay time regulation circuit of the present invention.

As shown in FIG. 6, delay time regulation circuit 301 of this embodiment is a construction that combines the circuit for obtaining a delay signal having a desired delay time shown in the first embodiment with the circuit for obtaining a pulse signal having a desired pulse width shown in the second embodiment.

In other words, delay time regulation circuit 301 of this embodiment is a construction including: first oscillator 302 and second oscillator 303 for outputting clocks of already known frequencies; clock selection circuit 304 for outputting as a test clock either first clock CLK1 that is outputted from first oscillator 302 or second clock CLK2 that is outputted from second oscillator 303; first selection circuit $305_1$ for selecting and outputting either a test clock that is outputted from clock selection circuit 304 or a reference signal, which is a delayed signal; second selection circuit $305_2$ for selecting and outputting either a test clock that is outputted from clock selection circuit 304 or a delay signal that is outputted from first variable delay circuit $300_1$; pulse generation circuit 308 for generating a pulse signal having a desired pulse width; flip-flop input selection circuit 309 for outputting either a delay signal that is outputted from first variable delay circuit $300_1$ or a delay signal outputted from second variable delay circuit $300_2$; change detection circuit 306 for finding the amount of change in delay time with respect to a delay time selection signal, which is a signal for setting the delay time of first variable delay circuit $300_1$ and second variable delay circuit $300_2$, according to test clocks that are applied to first variable delay circuit $300_1$ and second variable delay circuit $300_2$; and controller 307 for controlling each of clock selection circuit 304, first selection circuit $305_1$, second selection circuit $305_2$, change detection circuit 306, pulse generation circuit 308, flip-flop input selection circuit 309, first variable delay circuit $300_1$, and second variable delay circuit $300_2$.

Change detection circuit 306 employs, for example, a D-FF. The output signal of flip-flop input selection circuit 309 is applied to data input terminal (D) of the D-FF, and a test clock that is outputted from clock selection circuit 304 is applied to clock input terminal (CLK).

Pulse generation circuit 308 employs, for example, a D-FF for pulse generation. Power supply voltage $V_H$, which corresponds to a high level, is applied to data input terminal (D) of the pulse generation D-FF, the output signal of second selection circuit $305_2$ is applied to clock input terminal (CLK), and the output signal of second variable delay circuit $300_2$ is applied to reset input terminal (RST).

In a construction of this type, delay time regulation circuit 301 of this embodiment sets the desired delay time of first variable delay circuit $300_1$ by carrying out the same processing as the first embodiment by means of first oscillator 302, second oscillator 303, clock selection circuit 304, first selection circuit $305_1$, and change detection circuit 306.

In addition, a pulse signal having the desired pulse width is outputted from pulse generation circuit 308 as in the second embodiment by means of first oscillator 302, second oscillator 303, clock selection circuit 304, second selection circuit $305_2$, and change detection circuit 306. When setting the delay time of first variable delay circuit $300_1$, the output signal of first variable delay circuit $300_1$ is selected by flip-flop input selection circuit 309 in accordance with the input selection signal from controller 307, and this output signal of first variable delay circuit $300_1$ is then applied to change detection circuit 306. When setting the delay time of second variable delay circuit $300_2$, the output signal of second variable delay circuit $300_2$ is selected by flip-flop input selection circuit 309 and applied to change detection circuit 306.

Accordingly, a pulse signal that has the desired pulse width and that is delayed from the reference signal by exactly the desired delay time is outputted from pulse generation circuit 308.

Thus, as in the first and second embodiments, this embodiment enables correction of variations in delay time due to such factors as fluctuation in the power supply voltage, temperature changes, change in elapsed time, and difference in fabrication lot, and thus can obtain a pulse signal that has a desired delay time and pulse width that is free of the influence of variations. Increase in the number of gates in this case can be suppressed because, according to the construction of this embodiment, the correction of two variable delay circuits is performed by a single delay time regulation circuit.

Although the construction of the delay time regulation circuit described in this embodiment is capable of setting the delay times of two variable delay circuits, the delay times of still more variable delay circuit can be set by sequentially connecting a selection circuit and variable delay circuit in a series in the section following the second variable delay circuit shown in FIG. 6 and increasing the number of selections by the flip-flop input selection circuit. Such a construction can obtain a plurality of pulse signals having different delay times and pulse widths.

Further, although the construction described in this embodiment allows the delay times of two variable delay circuits to be set by a single delay time regulation circuit, the invention also allows a construction that allows the delay times of a plurality of variable delay circuits to be set by a plurality of delay time regulation circuits if there is sufficient room for accommodating a number of gates on a semiconductor chip.

While preferred embodiments of the present invention have been described using specific terms, such description is for illustrative purposes only, and it is to be understood that changes and variations may be made without departing from the spirit or scope of the following claims.

What is claimed is:

1. A method of regulating delay time for setting the delay time of a variable delay circuit to a desired value, comprising the steps of:

sequentially applying a plurality of clocks having different frequencies to said variable delay circuit and finding, for each clock, the amount of change in delay time with respect to change in a delay time selection signal, which is a signal for setting the delay time of said variable delay circuit;

finding a linear coefficient of the characteristic of the delay time of said variable delay circuit with respect to said delay time selection signal from the difference in said amounts of change with respect to the difference in the frequencies of said clocks;

finding the amount of offset with respect to said delay time selection signal that pertains to said variable delay circuit from said amounts of change and the frequencies of said clocks and;

finding said delay time selection signal from said linear coefficient and the difference between a desired delay time and said offset amount.

2. The method of regulating delay time according to claim 1 wherein:

said linear coefficient k is found from:

$$k=(C2-C1)/(\Delta C2-\Delta C1)$$

said amount of offset $T_{off}$ is found from:

$$T_{off}=(C2\times\Delta C1-C1\times\Delta C2)/(\Delta C2-\Delta C1)$$

and delay time Ts of said variable delay circuit that corresponds to said delay time selection signal that is necessary for obtaining said desired delay time is found from:

$$Ts=(Td-T_{off})/k$$

where the frequencies of any two clocks that are applied to said variable delay circuit are C1 and C2, said amounts of change that correspond to these two clocks are $\Delta C1$ and $\Delta C2$, and said desired delay time is Td.

3. A delay time regulation circuit for setting a delay time of a variable delay circuit to a desired value, comprising:

a plurality of oscillators for outputting clocks each having a different known frequency;

a clock selection circuit for selecting and outputting any one of the clocks outputted from said plurality of oscillators;

a selection circuit for selecting and outputting one of a clock outputted from said clock selection circuit and a reference signal, which is a delayed signal;

a change detection circuit for finding the amount of change in a delay time with respect to a delay time selection signal, which is a signal for setting the delay time of said variable delay circuit, according to said clocks that are applied to said variable delay circuit; and a controller for: sequentially applying said plurality of clocks to said variable delay circuit and finding, for each clock, the amounts of change of the delay time with respect to the change in said delay time selection signal; finding a linear coefficient of the characteristic of the delay time of said variable delay circuit with respect to said delay time selection signal from the difference of said amounts of change with respect to the difference of said clock frequencies; finding the amount of offset with respect to said delay time selection signal pertaining to said variable delay circuit from said clock frequencies and said amounts of change; and finding said delay time selection signal from said linear coefficient and the difference between a desired delay time and said amount of offset.

4. The delay time regulation circuit according to claim 3 wherein said change detection circuit is a D-flip-flop in which the delay signal outputted from said variable delay circuit is applied to a data input terminal and clocks outputted from said clock selection circuit are applied to a clock input terminal.

5. The delay time regulation circuit according to claim 3 wherein said controller:

finds said linear coefficient k from:

$$k=(C2-C1)/(\Delta C2-\Delta C1)$$

finds said amount of offset $T_{off}$ from:

$$T_{off}=(C2 \times \Delta C1 - C1 \times \Delta C2)/(\Delta C2-\Delta C1)$$

and finds delay time Ts of said variable delay circuit that corresponds to said delay time selection signal that is necessary for obtaining said desired delay time from:

$$Ts=(Td-T_{off})/k$$

where the frequencies of any two clocks that are applied to said variable delay circuit are C1 and C2, said amounts of change that correspond to these two clocks are $\Delta C1$ and $\Delta C2$, and said desired delay time is Td.

6. The delay time regulation circuit according to claim 3 that includes a pulse generation circuit in which output pulses rise with the rise of pulses applied to said variable delay circuit, and output pulses are reset by the rise of pulses outputted from said variable delay circuit.

7. The delay time regulation circuit according to claim 4 that includes a pulse generation circuit in which output pulses rise with the rise of pulses applied to said variable delay circuit, and output pulses are reset by the rise of pulses outputted from said variable delay circuit.

8. The delay time regulation circuit according to claim 5 that includes a pulse generation circuit in which output pulses rise with the rise of pulses applied to said variable delay circuit, and output pulses are reset by the rise of pulses outputted from said variable delay circuit.

* * * * *